(12) United States Patent
Partsch

(10) Patent No.: US 11,735,237 B2
(45) Date of Patent: Aug. 22, 2023

(54) LOW POWER MEMORY WITH ON-DEMAND BANDWIDTH BOOST

(71) Applicant: Rambus Inc., San Jose, CA (US)

(72) Inventor: Torsten Partsch, San Jose, CA (US)

(73) Assignee: Rambus Inc., San Jose, CA (US)

( * ) Notice: Subject to any disclaimer, the term of this patent is extended or adjusted under 35 U.S.C. 154(b) by 171 days.

(21) Appl. No.: 17/432,064

(22) PCT Filed: Feb. 25, 2020

(86) PCT No.: PCT/US2020/019606
§ 371 (c)(1),
(2) Date: Aug. 18, 2021

(87) PCT Pub. No.: WO2020/176448
PCT Pub. Date: Sep. 3, 2020

(65) Prior Publication Data
US 2022/0199132 A1   Jun. 23, 2022

Related U.S. Application Data

(60) Provisional application No. 62/811,414, filed on Feb. 27, 2019.

(51) Int. Cl.
*G11C 7/22* (2006.01)
(52) U.S. Cl.
CPC ...... *G11C 7/222* (2013.01); *G11C 2207/2227* (2013.01)
(58) Field of Classification Search
CPC .................................................. G11C 7/222
See application file for complete search history.

(56) References Cited

U.S. PATENT DOCUMENTS 6,021,264 A   2/2000   Morita
6,091,663 A   7/2000   Kim et al.
(Continued)

FOREIGN PATENT DOCUMENTS

WO   WO-2009-082502 A1   7/2009
WO   WO-2017-011351 A1   1/2017

OTHER PUBLICATIONS

EP Response filed Jan. 9, 2023 in Response to the Extended European Search Report dated Jun. 13, 2022 and the Communication Pursuant to Rules 70(2) and 70a(2) EPC dated Jun. 30, 2022 re: EP Appln. No. 20762997.3. 31 pages.
(Continued)

*Primary Examiner* — Jason Lappas
(74) *Attorney, Agent, or Firm* — Charles Shemwell

(57) ABSTRACT

In a memory component having a command/address interface, timing interface and data interface, the command/address interface receives a first command/address value from a control component during a first interval and a second command/address value from the control component during a second interval. The timing interface receives a data strobe from the control component during the first interval and a data clock from the control component during the second interval, the data strobe departing from a parked voltage level to commence toggling at a time corresponding to reception of the first command/address value, and the data clock toggling throughout the second interval regardless of second command/address value reception-time. The data interface samples first write data corresponding to the first command/address value at times indicated by toggling of the data strobe, and samples second write data corresponding to the second command/address value at times indicated by toggling of the data clock.

21 Claims, 4 Drawing Sheets

(56) References Cited

U.S. PATENT DOCUMENTS

| | | | |
|---|---|---|---|
| 6,529,993 | B1 | 3/2003 | Rogers et al. |
| 6,603,686 | B2 | 8/2003 | Yoo et al. |
| 6,675,272 | B2 | 1/2004 | Ware et al. |
| 6,728,144 | B2 | 4/2004 | Nygren |
| 6,795,906 | B2 | 9/2004 | Matsuda |
| 6,807,613 | B1 | 10/2004 | Keeth et al. |
| 6,836,503 | B2 | 12/2004 | Best et al. |
| 6,917,561 | B2 | 7/2005 | Moss et al. |
| 7,062,625 | B1 | 6/2006 | Shrader et al. |
| 7,245,553 | B2 | 7/2007 | Lin et al. |
| 7,269,699 | B2 | 9/2007 | Jang |
| 7,697,369 | B2 | 4/2010 | Koshizuka |
| 8,234,422 | B2 | 7/2012 | Linam et al. |
| 8,352,696 | B2 | 1/2013 | Hampel |
| 8,451,674 | B2 | 5/2013 | Kizer et al. |
| 8,593,901 | B2 | 11/2013 | Oh et al. |
| 8,824,224 | B2 | 9/2014 | Ware et al. |
| 8,938,578 | B2 | 1/2015 | Gopalakrishnan et al. |
| 9,111,607 | B2 | 8/2015 | Gay |
| 9,214,205 | B2 | 12/2015 | Koshizuka |
| 9,535,451 | B2 | 1/2017 | Shin et al. |
| 9,905,288 | B2 | 2/2018 | Ryu et al. |
| 10,395,701 | B1 * | 8/2019 | Ho .................... G11C 11/4093 |
| 2005/0007836 | A1 | 1/2005 | Morzano et al. |
| 2007/0201286 | A1 | 8/2007 | Oh |
| 2011/0058432 | A1 | 3/2011 | Yang et al. |
| 2015/0302905 | A1 | 10/2015 | Lee et al. |
| 2016/0365135 | A1 | 12/2016 | Gopalan et al. |
| 2018/0067538 | A1 | 3/2018 | Ware et al. |
| 2018/0294999 | A1 | 10/2018 | Giovannini et al. |

OTHER PUBLICATIONS

"Low Power Double Data Rate (LPDDR) 5" Feb. 2019 JEDEC Standard No. 209-5 p. 1-396, JEDEC Board Ballet JCB-18-50, formulated under the cognizance of the JC-42.6 Subcommittee on Low Power Memories, 2019. 422 pages.

JEDEC Standard, Graphics Double Data Rate (GDDR6) SGRAM Standard, JESD250 Jul. 2017. 190 pages.

Notification of Transmittal of the International Search Report and the Written Opinion of the International Searching Authority, or the Declaration dated May 15, 2020 re: Int'l Appln. No. PCT.US2020/019606. 13 pages.

EP Extended European Search Report dated Jun. 13, 2022 re: EP Appln. No. 20762997.3. 9 pages.

\* cited by examiner

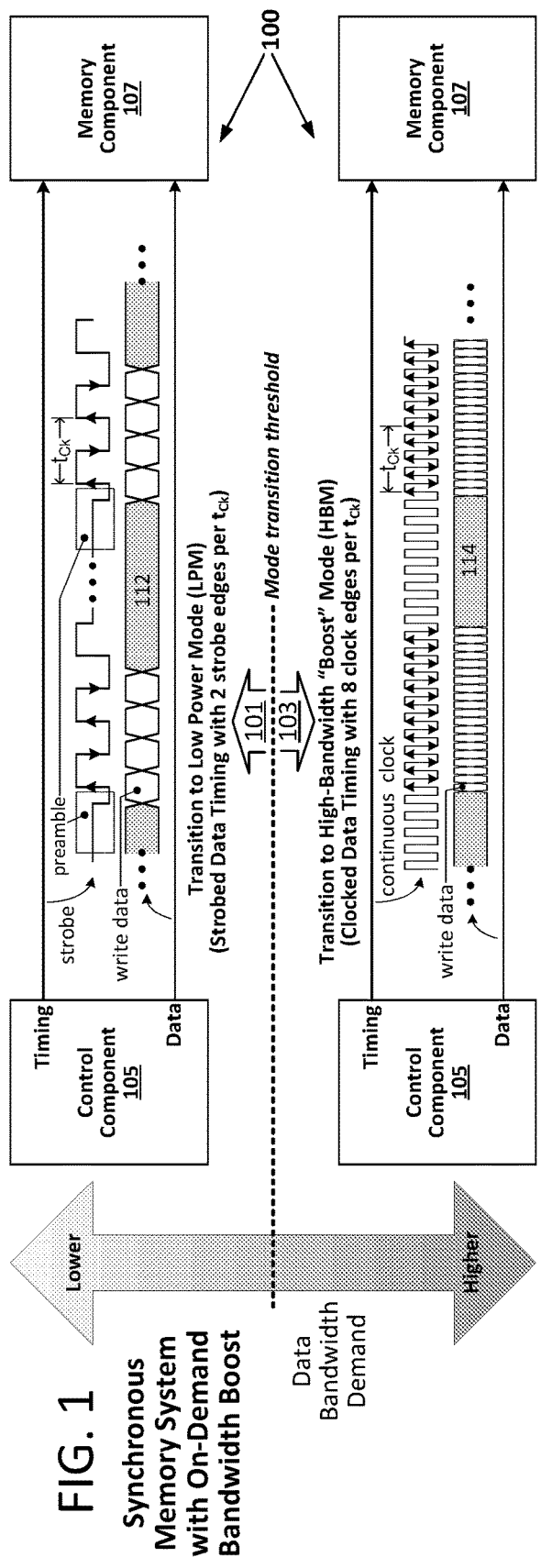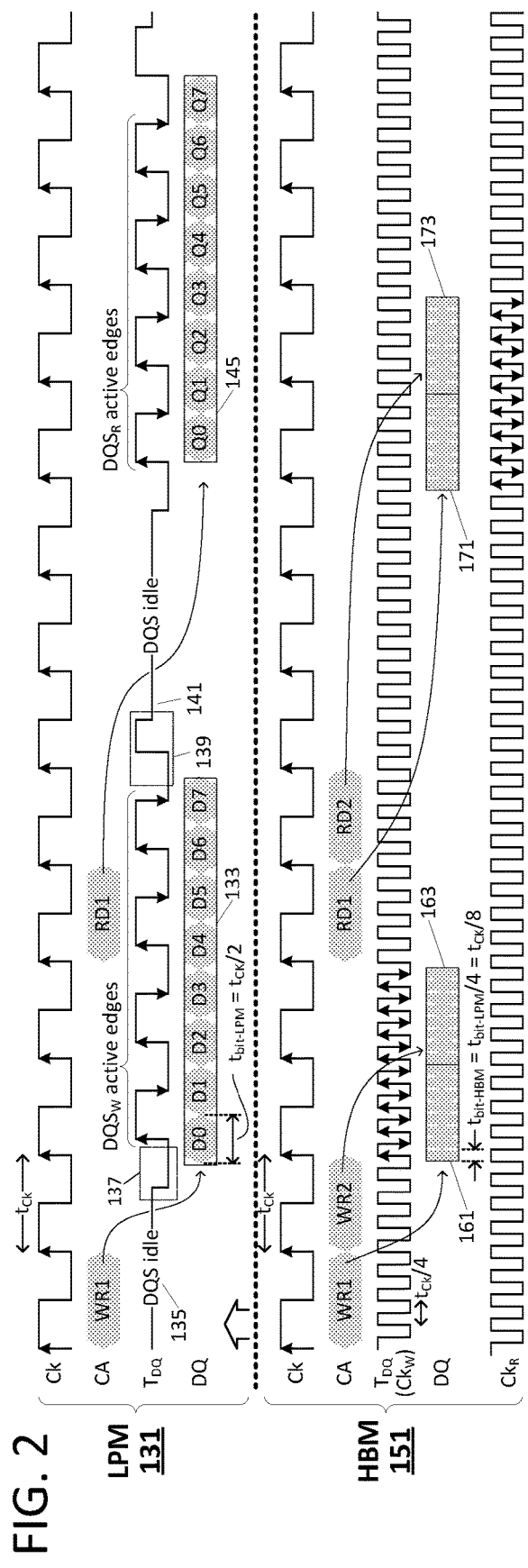

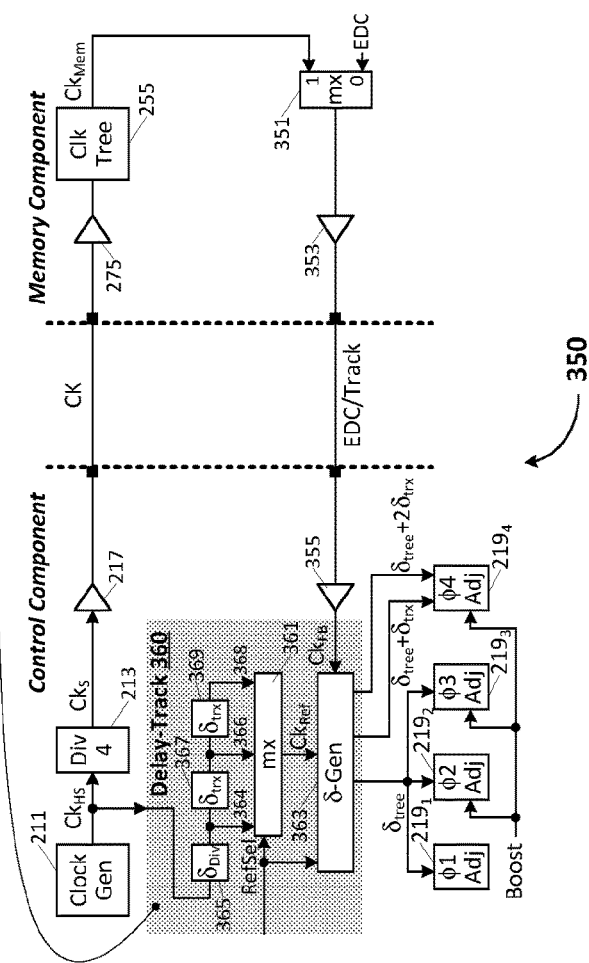

dies and interconnected by wired control, timing and data signaling links (only the latter two of which are depicted in FIG. 1) —links that may extend across a substrate (motherboard or interposer, for example, in a modular memory system), or that may extend vertically or laterally through conductive vias, wirebonds, cables, and so forth within a multi-die integrated circuit package (e.g., control component and one or more memory components implemented in a stacked-die memory package). Further, while the memory systems in FIG. 1 and embodiments below are generally depicted in the context of a single memory component 107,
LOW POWER MEMORY WITH ON-DEMAND BANDWIDTH BOOST

TECHNICAL FIELD

The present disclosure relates generally to data processing and more particularly to memory systems and components thereof.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a synchronous memory system that transitions dynamically between a low-power strobe-based data transfer mode and a high-bandwidth continuously-clocked "boost" mode;

FIG. 2 illustrates additional signaling detail in the low-power and boosted bandwidth modes shown in FIG. 1;

Figure 3:
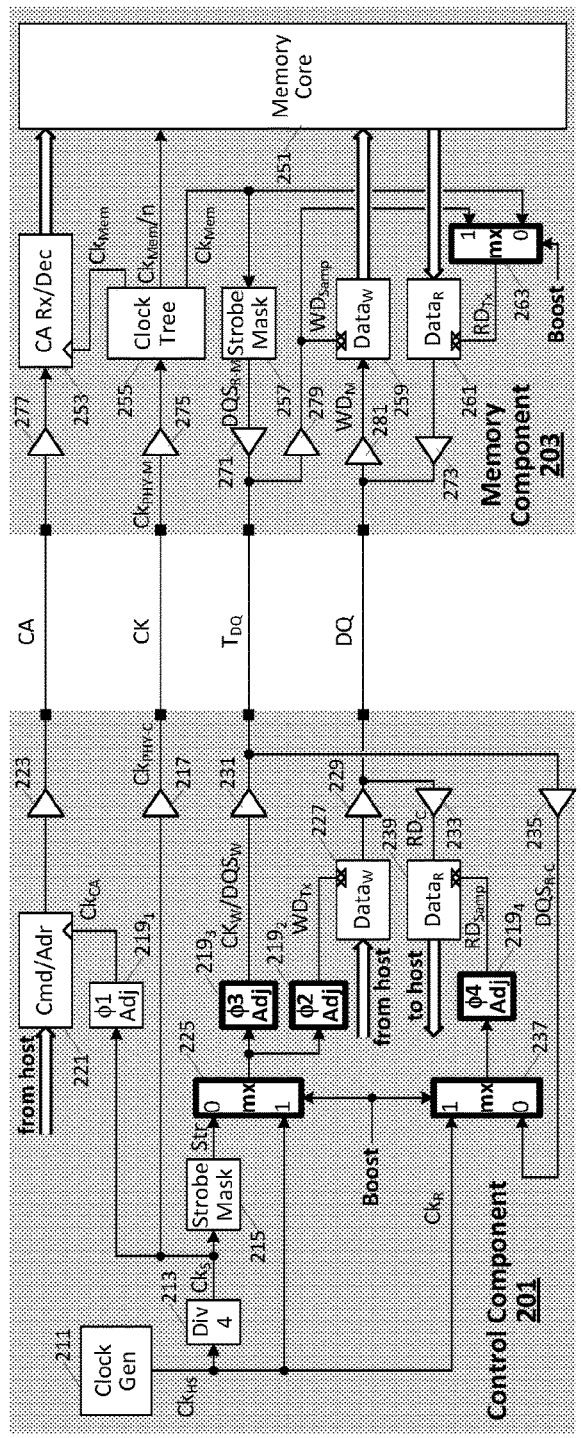
FIG. 3 illustrates an embodiment of a memory system having control and memory components capable of transitioning between the low-power and bandwidth-boosted data transmission modes described in reference to FIGS. 1 and 2.
Figure 4:
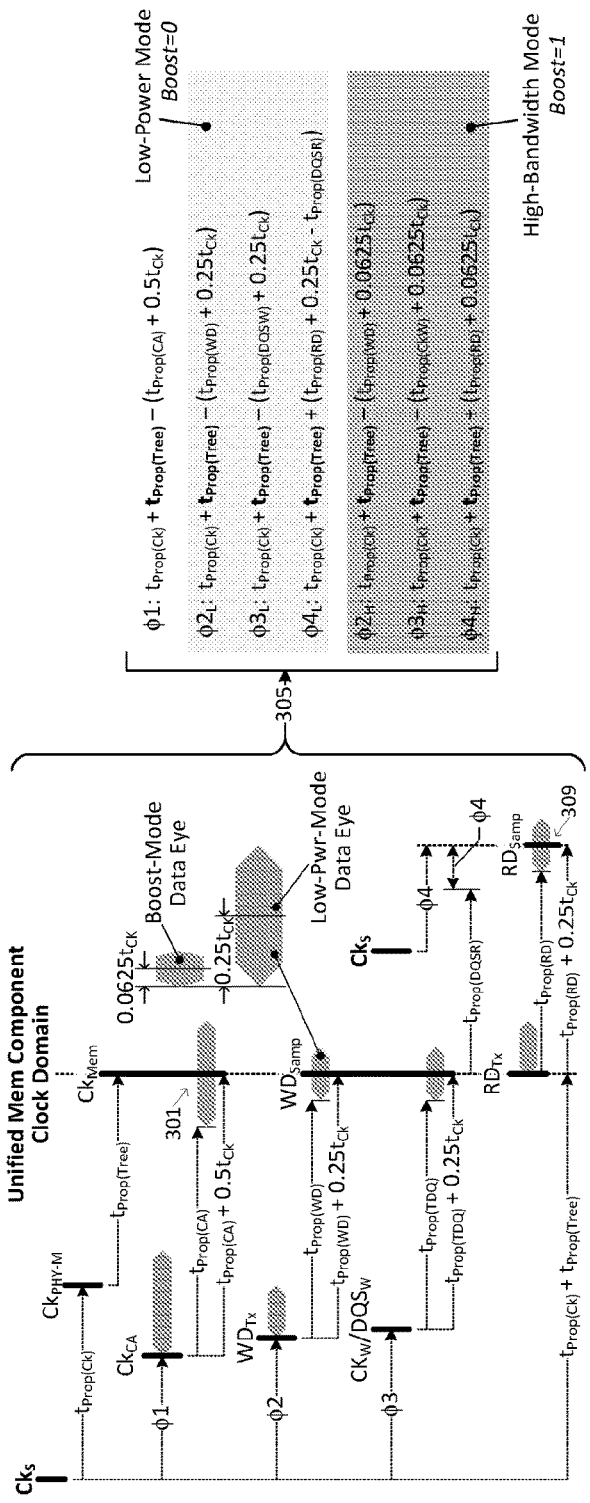
FIG. 4 illustrates exemplary time-varying phase offsets between the unified memory clock domain within the embodiment of FIG. 3 and timing signals generated within the control component.
Figure 6:
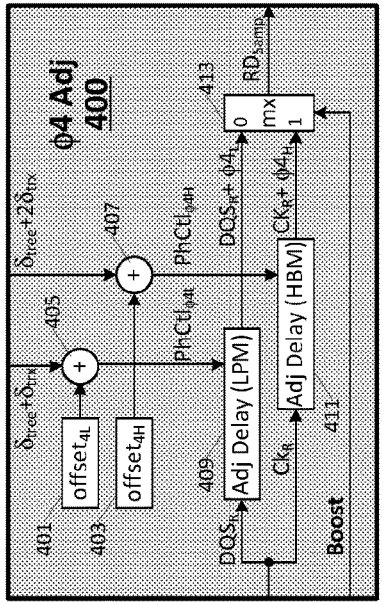
Figure 7:
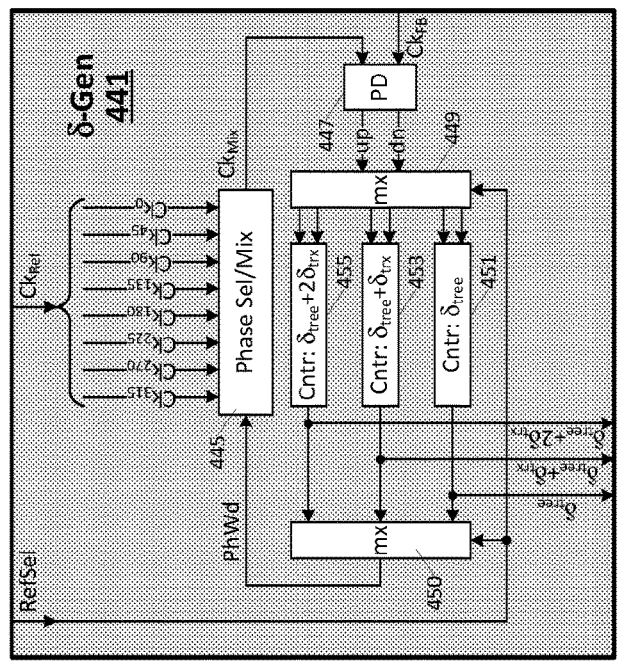
Figure 5:
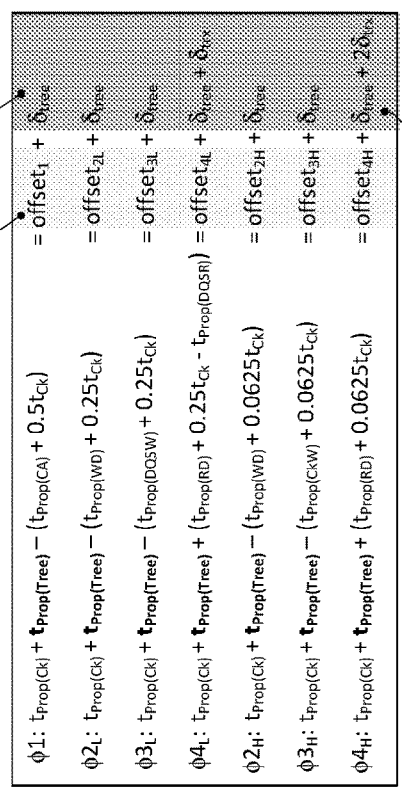
Figure 9:
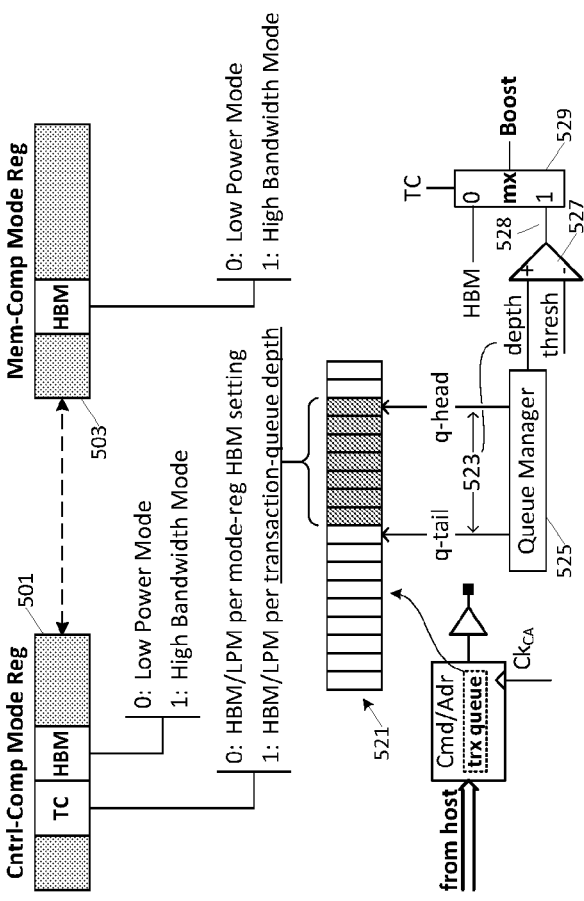
Figure 8:
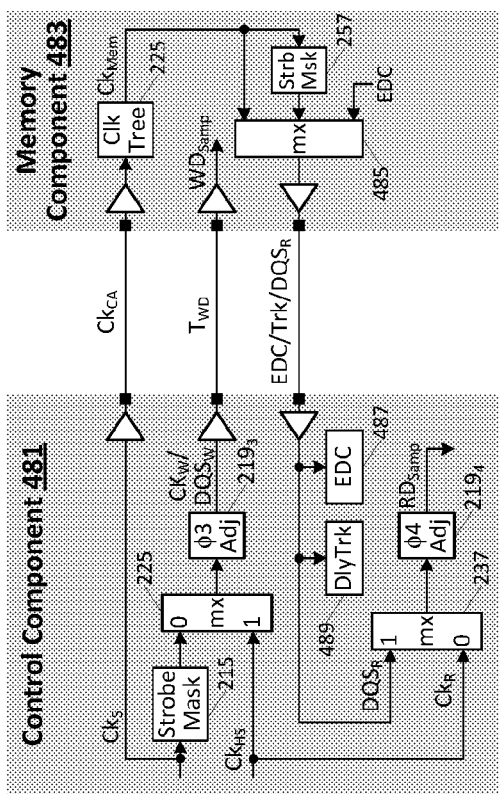
Figure 10:
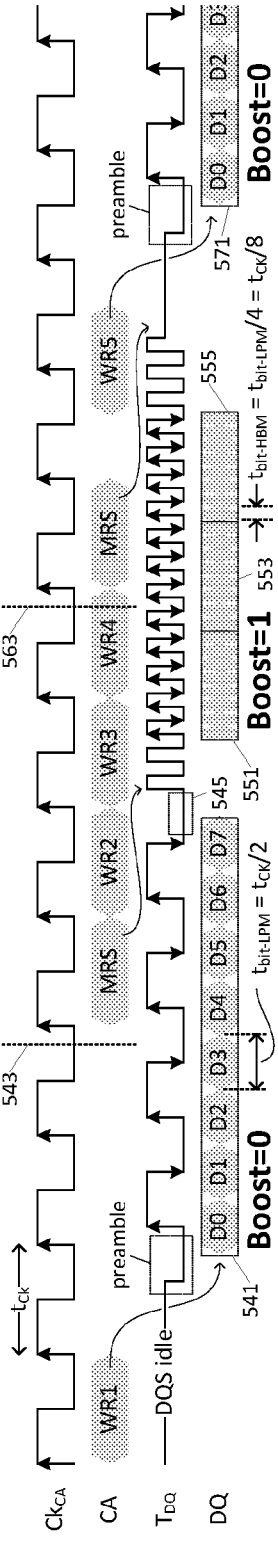

FIG. 5 restates the delay expressions shown in FIG. 4 in terms of an initial phase offset and a time-drifting voltage/temperature-dependent delay, showing an embodiment of a delay-tracking arrangement implemented within the memory system of FIG. 3 to periodically (or occasionally) adjust timing delays imposed by phase-adjust circuits therein and thus compensate for time-varying timing-domain skew;

FIG. 6 illustrates an embodiment of a phase-adjust circuit that may be used to implement phase-adjust circuits as shown in FIGS. 3-5;

FIG. 7 illustrates an embodiment of a delay generator circuit that may be used to implement the delay generator shown in FIG. 5;

FIG. 8 illustrates an alternative embodiment of a memory system having on-demand bandwidth boost and that conveys read and write data strobe signals between a control component and a memory component via separate (respective) signaling links while operating in low-power mode;

FIG. 9 illustrates exemplary mode registers and that may be implemented respectively within the various control and memory component embodiments discussed herein; and FIG. 10 illustrates memory system transition from low-power mode to high-bandwidth mode and then back to low-power mode, showing exemplary command write data and write-data timing signals during the mode transitions.

DETAILED DESCRIPTION

In various embodiments herein memory controllers and memory components transition (e.g., on demand) between two or more different synchronous data transfer modes, operating in a relatively low-power data transfer mode until, for example, high transfer bandwidth is required and then transitioning to a high bandwidth "boost mode." In a number of embodiments, read and write data transfer between memory and control components is timed by source-synchronous data strobe signals in the low-power mode— timing signals that transition to indicate presence of valid data on an accompanying data path but are otherwise parked at steady-state levels (i.e., no toggling during idle periods in which no data is transmitted) —and is timed by "free running" clock signals that toggle continuously (e.g., in the high-bandwidth boost mode), regardless of whether data is conveyed on the accompanying data path (i.e., clock toggles during both data transfer intervals and idle intervals). To limit system power consumption, memory components are generally implemented without timing alignment circuitry (e.g., no locked-loop circuitry) and instead rely on the control component (the "controller") to phase-adjust control-side timing signals as necessary to accommodate a memory-side timing domain that drifts with voltage and temperature relative to a controller-generated system clock. Periodic timing calibration operations are carried out with respect to mode-specific data timing signals to establish phase delays that accommodate seamless transition between low-power and boosted bandwidth modes. During run-time transition between those modes, controller-imposed timing delays are swapped on the fly (i.e., during system operation) to enforce the mode-specific timing alignment, effecting internal phase-jumping (i.e., instantaneous or near-instantaneous changes in phase) with respect to read and write data timing signals applied within the control component. In a number of embodiments or programmed configurations, the memory system transitions between low-power and boosted-bandwidth modes according to host instructions (e.g., instructions from processor within host computing device or appliance) that establish programmed settings within the control component (which the control component may propagate to the memory component). In other embodiments or programmed configurations, the control component may autonomously transition between low-power and boosted-bandwidth modes, for example, in accordance with memory transaction volume, source-power status (battery versus line power), etc. These and other features and embodiments are discussed in further detail below.

FIG. 1 illustrates an embodiment of a synchronous memory system 100 that transitions dynamically (i.e., during mission operation and thus on the fly or on demand) between a strobe-based data transfer mode 101 and a continuously-clocked "boost" mode 103 according to host memory-bandwidth requirements—generally referred to herein as "low-power mode (strobe-based) and high-bandwidth mode, though in all cases the transition between strobe-timed data transfer and continuous-clock-timed data transfer may be motivated by various factors other than (or in addition to) power-reduction/bandwidth-demand. As shown, memory system 100 includes a memory control component 105 ("control component" or "controller") and a memory component 107, the former issuing command/address values (control information) as necessary to effect memory read and write access within a data storage array of the latter. In general, the control and memory components are implemented in distinct (respective) integrated-circuit the system will generally include multiple memory components 107 per control component 105, with each memory component implemented in a respective integrated circuit die. In the case of a modular memory system, for example, multiple memory components 107 may be disposed side-by-side on a memory module substrate (i.e., daughterboard substrate having printed traces that extend from module contacts to memory components and thus allow removable insertion into module connectors on motherboard or backplane) each coupled to the control component via a respective set of data signal links (and data timing links) and a shared command/address path to enable operation of those multiple memory components in lock-step (simultaneous and parallel data transfer to/from) as a memory rank. Multiple memory ranks may be implemented on the same memory module (e.g., at least one rank on each face of a dual-inline memory module, or multiple ranks per module-face in the case of stacked packages of memory components). In yet other embodiments, capacity extension from one rank to two ranks (or one set of ranks to two sets of ranks) may be implemented through a master-slave stack in which an initial "master" memory module interfaces with the control component via point-to-point signaling links as discussed above, and interfaces separately with the capacity-extending "slave" memory module. That is, memory components within the slave memory module interface via point-to-point signaling links with counterparts on the master memory module via a pre-processed protocol (i.e., master memory module serving as intermediary for signals destined for and arriving from the host component), with multi-modal data transfer between master-module memory components and slave-module memory components according to the strobe-based and continuously-clocked operating modes discussed herein. In all cases the memory modules may include registered clock drivers (RCDs) or other command/address buffering components, as well as data buffer components, that transition between low-power and boosted-bandwidth signaling modes together with the memory and control components. More specifically, the various mode-specific circuits and multi-modal data transfer discussed with respect to memory component embodiments herein applies equally to data buffer components. Further, while memory system operation (e.g., transaction protocol and timing) is generally presented herein in the context of a memory component having a dynamic random access memory (DRAM) storage core, any practicable core storage technology may be deployed within such memory components (e.g., static random access memory, flash memory, phase-change memory, magneto-resistive memory, etc.).

Still referring to FIG. 1, data transfer is timed by a source-synchronous strobe signal in the low-power mode shown at 101. That is, a strobe signal from the data transmitting component toggles with a predetermined phase relation to the data signal—a center-eye-aligned write-data strobe from control component 105 to memory component 107 in the depicted write-data example—and is parked at a neutral voltage during idle periods (intervals in which no data is transmitted). Active edges (marking presence of valid data on the counterpart data path) in an otherwise parked timing strobe are preceded and succeeded by preamble and postamble waveforms—protocol-defined start/stop symbols that increase signaling noise (especially inter-symbol interference (ISI)) relative to a symbol-less free-running clock and thus generally constrain maximum signaling rate below that achievable with a free-running clock. Accordingly, when bandwidth demand exceeds a given threshold, memory system 100 may transition (autonomously or in response to host instruction) from the low-power strobe-based data timing mode 101 to a high-bandwidth continuously-clocked data timing mode as shown at 103 (i.e., no parking, preamble or post-amble in the data timing signal during high-bandwidth operating mode). In the FIG. 1 example, the data strobe cycles (during data conveyance in low-power mode 101) at a system clock rate to time transmission of two sequential data bits per link per system clock cycle ($t_{Ck}$) (i.e., one bit per rising strobe edge and one bit per falling strobe edge). By contrast, the free-running "data clock" cycles multiple times per $t_{Ck}$ interval, accelerating data transfer (boosting data bandwidth) by the ratio of the data clock and system clock frequencies. In the 4× boost-mode example shown at 103 (i.e., four data clock cycles per $t_{Ck}$ interval), the data transfer rate is 4× (four times) that of the low-power mode, with data being transferred on each of the eight data clock edges (rising and falling) within a given $t_{Ck}$ interval—that is, 8 data bits per link per $t_{Ck}$ interval instead of the 2 bits per link per $t_{Ck}$ interval in low-power mode. In contrast to the idling strobe in low-power mode 101 (strobe parked during idle, no-data-transmission intervals 112), the free running (continuously toggling) data clock continues to cycle during idle intervals, obviating preamble/postamble waveforms and thus avoiding signal degrading ISI. In the FIG. 1 example, when bandwidth demand drops below the mode transition threshold (which may be hysteretic), memory system 100 transitions autonomously or in response to host instruction back to low-power mode to limit power consumption. As discussed below, factors other than bandwidth demand may impact the transition between low-power and high-bandwidth operating modes (e.g., indication that the host system is operating on line power and/or above or below thermal limits).

FIG. 2 illustrates additional signaling detail in the low-power and boosted bandwidth modes shown in FIG. 1. In both modes, memory access commands and corresponding memory addresses (collectively, "CA values") are conveyed from the control component to one or more memory components via command/address signaling links (CA) synchronously with respect to a system clock signal (itself transmitted from control component to memory component via clock link, Ck). Referring first to the low-power mode timing diagram 131, for example, a write command and associated address (indicated collectively by command/address value "WR1") are conveyed on the CA signaling path during a cycle of the system clock, followed by a strobe-timed data burst 133 on bidirectional data path (DQ). As shown, the write data strobe signal (conveyed on chip-to-chip data timing link, $T_{DQ}$) transitions from an idle state at 135, through a preamble phase at 137 before active-edge toggling to time memory-side reception (i.e., write-data reception within a memory component at times indicated by the active strobe edges) of the serial 8-bit write data burst 133 (i.e., bits D0-D8) on the counterpart DQ signaling path. After data conveyance, the strobe concludes with a postamble 139 before returning to idle (i.e., parked at a predetermined voltage level) at 141. Shortly thereafter, a memory read command/address value "RD1" is conveyed on the CA signaling path to trigger memory-side read data retrieval and strobe-timed read data transmission. That is, the memory component responds to the RD1 command/address value by retrieving data from a core storage location indicated by the RD1 address (which address may correspond to a location of a column of data within an "activated" data page in a DRAM component) and then transmitting to the control component both (i) the retrieved read data in one or more serial bit streams 145 (Q0-Q7) over respective data signaling links and (ii) a read data strobe signal having a predetermined phase alignment with the serial data burst (e.g., strobe edges aligned with edges of read-data "eyes" as shown).

Referring now to the boosted-bandwidth waveforms shown at 151, write command/address values WR1 and WR2 are transmitted from the control component to the memory component in successive system clock cycles, followed by respective continuously-clocked data bursts at 161 and 163—that is, data bursts transmitted synchronously with a free-running write data clock, $Ck_W$ (transmitted over timing link $T_{DQ}$), that cycles at 4× the system clock rate. Continuing with the exemplary 4× bandwidth boost discussed above, each of the 8-bit write data bursts 161, 163 transpires over a single $t_{Ck}$ interval (though not necessarily start/stop-aligned with system clock edges) and thus in one-fourth the time required for an 8-bit strobe-timed data burst (i.e., each boost-mode bit interval, $t_{bit-HBM}$, is one fourth that of the low-bandwidth mode bit time, $t_{bit-LPM}$, and one-eighth of a $t_{Ck}$ interval), thus enabling as many as four 8-bit data bursts (only two being shown) in the same time required for a single 8-bit data burst in low-power mode. Back-to-back read command/address values RD1 and RD2 are likewise transmitted to the memory component in successive clock cycles and trigger 4× accelerated read bursts 171, 173 that arrive at the control component in alignment with an internally generated read clock ($Ck_R$) that also oscillates at a 4× frequency relative to the system clock.

As discussed below, conveyance of the boost-mode write clock to the memory component provides the memory-side timing edges needed for boost-mode read data transmission, with return read-data timing signal transmission (from memory component to control component) obviated by controller generation of $Ck_R$. More specifically, in a number of embodiments, the control component internally generates and phase-adjusts the boost-mode read clock (CkR) for alignment with eye-centers of incoming read data. In other embodiments, the memory component may turn around the incoming boost-mode write data clock, transmitting that clock to back to the control component to serve as the boost-mode read data clock. Further, while the 4× bandwidth boost is carried forward in examples presented below, in all cases bandwidth and/or signaling rate may be increased by factors more or less than four. Also, while selection between boost-bandwidth and low-power operating modes is generally presented as a binary transition from one bandwidth to the other, multiple scaled bandwidth modes may be selected (e.g., 2×, 4×, 8×, 16× as well as non-power-of-two bandwidth-boost factors).

FIG. 3 illustrates an embodiment of a memory system 200 having control and memory components 201 and 203 capable of transitioning between the low-power and bandwidth-boosted data transmission modes described in reference to FIGS. 1 and 2. As shown, control component 201 includes a clock generator 211 to generate a high-speed clock signal ($Ck_{HS}$), a clock divider 213 that frequency-divides the high-speed clock signal to produce a system clock signal ($Ck_S$), and a strobe-mask circuit 215 that generates a data strobe signal (Str) in response to the system clock signal (i.e., enforcing the preamble/postamble/idle protocol discussed above). The system clock signal is forwarded to (transmitted to) the memory component via signal driver 217 and system clock link (CK) and is also supplied to a phase-adjust circuit $219_1$ to generate a command/address clock signal ($Ck_{CA}$)—a phase-adjusted version of the system clock signal (i.e., clock signal having same frequency as, but phase offset from, $Ck_S$). $Ck_{CA}$ is supplied, in turn, to the timing input of command/address storage buffer 221 to time the progression of command/address values (received from a processor or other memory-access-requesting component of the host system) through a transaction queue therein and thus control the time at which those command/address values are transmitted to memory component 203 via driver 223 and command/address signaling links (CA).

Continuing with FIG. 3, the high-speed clock and data strobe signal ($Ck_{HS}$ and Str) are supplied to respective inputs of mode-controlled multiplexer 225 which forwards one of those two timing signals to phase-adjust circuits $219_2$ and $219_3$ in accordance with a mode-control signal referred to herein as the boost-mode signal or boost signal (shown as "Boost" in FIG. 3). The boost signal is asserted (e.g., to a logic '1') to enable boosted-bandwidth operation (i.e., high-bandwidth mode) and deasserted to enable low-power operation, configuring multiplexer 225 accordingly to pass either the high-speed clock signal (Boost=1), or strobe signal (Boost=0) to phase-adjust circuits $219_2$ and $219_3$. Phase-adjust circuit $219_2$ supplies, as a phase-adjusted version of the multiplexer output, a write-data transmit signal ($WD_{Tx}$) to the double-data-rate timing input of write data queue 227 to synchronously advance write data values (received from a processor or other component of the host system) therethrough for sequential output via signal driver 229 and thus control the transmit timing of write data values to memory component 203 via data signaling links, DQ. Data within write data queue 227 may be deserialized prior to conveyance to signal driver 229, thus enabling the write data queue to be loaded at a lower frequency with write data values wider than the DQ path. Phase-adjust circuit $219_3$ supplies a phase-adjusted version of the timing signal output by multiplexer 225 ($Ck_{HS}$ or Str) to signal driver 231 to be output via data timing link $T_{DQ}$ as either a write data strobe signal ($DQS_W$) or write-data clock signal ($Ck_W$) according to the boost signal state—in either case providing a write-data timing signal that arrives at memory component 203 in a desired phase alignment with the write data transmitted via the DQ links.

During low-power operation (Boost=0), read data arriving via the DQ links and signal buffer/amplifier 233 are accompanied by a read-data strobe signal ($DQS_R$) conveyed on the data timing link ($T_{DQ}$) and conditioned within buffer/amplifier 235. The read-data strobe signal propagates through multiplexer 237 (i.e., while Boost=0 to effect low-power operating mode) and phase adjust circuit $219_4$, the latter yielding a read-data sampling signal ($RD_{Samp}$) that times double-data-rate read data sampling within (and progression through) read data queue 239 (i.e., capturing or latching read data arriving via buffer/amplifier 233). During high-bandwidth operation (Boost=1), multiplexer 237 forwards the high-speed clock (also referred to as a read-data clock, $Ck_R$) from clock generator 211 to phase-adjust circuit $219_4$ which, in turn, outputs a continuously toggling (no preamble/postamble/idle) read-data sampling signal ($RD_{Samp}$) having a desired phase alignment with respect to incoming read data (e.g., clock edges centered within respective read-data eyes)—the continuously-toggling read-data sampling signal timing the sampling of incoming data signals (e.g., transmitted at 4× data rate relative to low-power mode) within read-data queue 239 and the progression of sampled data therethrough. In either operating mode, high-bandwidth or low-power, deserializing circuitry within read-data queue 239 may assemble successively sampled read values into host-facing read-data values (i.e., data values to be conveyed to host processor or other host component) wider than the DQ path.

Though not specifically shown in FIG. 3, data windowing circuitry may be provided within write-data queue 227 and read-data queue 239 to mask transitions (edges) of the read-data sampling signal ($RD_{Samp}$) and write-data transmit signal ($WD_{Tx}$) other than those corresponding to valid read and write data transfer events. In both continuously-clocked and strobed-time data reception/transmission, for example, the control component may generate write and read data windowing signals (e.g., having a deterministic phase relation to command/address values transmitted to memory component 203) that are supplied to write-data queue 227 and read-data queue 239, respectively, to gate the incoming timing signals ($WD_{Tx}$ and $RD_{Samp}$) such that only timing signal edges corresponding to valid data values are applied to trigger data transmission/data sampling (e.g., masking preamble/postamble transitions of data strobe signals in data-strobed operating mode, and masking edges of the free-running clock signals $Ck_R$ and $Ck_W$ during DQ-idle intervals in data-clocked operating mode).

Still referring to FIG. 3, memory component 203 includes a memory core 251, command/address decoder 253 (i.e., sampling and decode circuitry), clock tree 255, strobe-mask circuit 257, write and read data queues 259 and 261, mode-controlled multiplexer 263, output drivers 271 and 273, and signal buffer/amplifiers 275, 277, 279 and 281. The incoming system clock (i.e., arriving via clock link Ck and buffer/amplifier 275) propagates through clock tree 255 to yield multiple phase-aligned memory clock signals ($Ck_{Mem}$) which are distributed to various other synchronous circuit elements, including command/address decoder 253, strobe-mask circuit 257, and—by way of mode-controlled multiplexer 263—read data queue 261 (i.e., as read-data transmit timing signal, $RD_{Tx}$). By timing command/reception and read data transmission with phase-aligned clock signals, $Ck_{Mem}$, and by timing operations within the memory core with a core clock ($Ck_{Mem}/n$) also phase-aligned with $Ck_{Mem}$ (e.g., core clock generated within clock tree as a frequency-divided instance of $Ck_{Mem}$), a nominally unified timing domain—defined by $Ck_{Mem}$ edges—is established within memory component 203. The unified timing domain remains operative upon transition to boosted-bandwidth mode as the incoming write-data timing signal (i.e., $Ck_W$ conveyed via driver 231, link $T_{DQ}$ and buffer/amplifier 279) is phase-adjusted within controller 201 to align $WD_{Samp}$ and $RD_{Tx}$ (the latter selected via multiplexer 263 in response to boost signal assertion) with the memory clock signal, an operation discussed in greater detail below. As with counterpart data queues within control component 201, memory-side data queues (259, 261) may include data windowing circuitry to mask all transitions (edges) of the write-data sampling signal ($WD_{Samp}$) and read-data transmit signal ($RD_{Tx}$) except those corresponding to valid write and read data transfer events—circuitry controlled deterministically by command/address receiver-decoder 253 in response to incoming command/address values.

In a number of embodiments, clock generator 211 within control component 201 is implemented by a phase-locked loop (PLL) or delay-locked loop (DLL) that phase-aligns the high-speed clock (and/or system clock) with a reference clock signal (not shown) having a relatively steady frequency despite drifting (time-varying) system temperature and supply voltage. By contrast, the open-loop timing architecture within memory component 203 permits the memory clock domain to drift with voltage and temperature relative to the system clock forwarded by control component 201. Clock tree 255 in particular (e.g., implemented by branches of inverters fanning out from a root to yield multiple memory clock instances with like phase-delay relative to the clock tree input) tends to be sensitive to changes in temperature and voltage—so much so that the memory clock signal ($Ck_{Mem}$) may drift by 180°, 360° or more relative to the incoming system clock (e.g., system clock instance $Ck_{PHY-M}$ at the physical signaling interface of memory component 203), meaning that skew between the system and memory clocks may change by more than one or more bit times in low-power mode and by many bit times in high-bandwidth mode.

In the embodiment of FIG. 3, consequences of time-varying skew between the system and memory clocks is compensated by phase-adjust circuits $219_1$-$219_4$ within control component 201, an arrangement that avoids complex and power-hungry timing alignment circuitry in the memory component (which will, in most practical deployments, be present in numerous instances per control component instance). More specifically, phase-adjust circuit $219_1$ adjusts the phase of the command/address clock ($Ck_{CA}$) to time command/address transmission such that command/address values arrive at the sampling input of memory-side command/address decoder 253 in a desired timing alignment with the memory clock domain (e.g., $Ck_{Mem}$ edge nominally aligned with center of command/address valid interval). Phase-adjust circuits $219_2$ and $219_3$ similarly adjust the phases of the write-data transmit signal ($WD_{Tx}$) and write data timing signal ($Ck_W/DQS_W$), respectively, to effect memory-side arrival of the write data and write data sampling signal (i.e., $WD_M$ and $WD_{Samp}$, respectively) in a desired phase relation with respect to each other and the memory clock signal. Phase-adjust circuit $219_4$ effects an equivalent control-side timing alignment for read data reception—adjusting the phase of the read-data sampling signal ($RD_{Samp}$) for alignment with inbound read data (i.e., at input to read data queue 239 as shown at $RD_C$) transmitted by the memory component in response to either the memory clock signal (low-power mode) or a high-speed clock (boost mode—$WD_{Samp}$) aligned with the memory-side timing domain. More specifically, in low-power mode, phase-adjust circuit $219_4$ adjusts the phase of an incoming read data strobe $DQS_R$ (denoted $DQS_{R-M}$ at the output of strobe-mask circuit 257 and $DQS_{R-C}$ at the output of controller-side buffer amplifier 235 in view of the propagation-time offset between those points in space) for alignment with incoming read data ($RD_C$), and in high-bandwidth mode, circuit $219_4$ adjusts the phase of internally sourced high-speed read clock $Ck_R$ (i.e., $Ck_{HS}$ or an instance thereof) for alignment with $RD_C$.

FIG. 4 illustrates exemplary time-varying phase offsets between the unified memory clock domain (represented by $Ck_{Mem}$) within the embodiment of FIG. 3 and timing signals generated within the control component. As shown, the system clock at the input of control-side buffer/amplifier 223 (i.e., $Ck_S$ as also shown in FIG. 3) leads the memory clock signal by the propagation time over clock link CK (i.e., $t_{Prop(Ck)}$) plus the propagation delay through clock tree 255 (i.e., $t_{Prop(Tree)}$). In order for command/address values to be sampled by the memory clock signal at eye center (i.e., as shown at 301), the CA transmit clock ($Ck_{CA}$) should lead the memory clock signal ($Ck_{Mem}$) by the command/address propagation delay over the CA links, $t_{Prop(CA)}$, plus half the CA eye duration (i.e., half a system clock cycle or $0.5\ t_{Ck}$ in the low-power-mode example shown). Accordingly, phase-adjust circuit $219_1$ is configured to delay the system clock signal ($Ck_S$) by the difference between the $Ck_S$-to-$Ck_{Mem}$ phase lead and the desired $Ck_{CA}$-to-$Ck_{Mem}$ phase lead or $t_{Prop(Ck)} + T_{Prop(Tree)} - T_{Prop(CA)} - 0.5\ t_{Ck}$; a time-varying phase delay (or phase offset) shown in FIG. 4 as ϕ1. Note that signal-driver and buffer/amplifier pairs are part of both phase leads (i.e., 217/275 and 223/277), so that their nominally matched delay times cancel one another.

Phase-adjust circuit $219_2$ is similarly configured to delay the high-speed clock (or write data strobe depending on operating mode) according to the difference between the $Ck_S$-to-$Ck_{Mem}$ phase lead and the desired $WD_{Tx}$-to-$Ck_{Mem}$ phase lead or $t_{Prop(Ck)} + t_{Prop(Tree)} - T_{Prop(WD)} - 0.5*$data-eye-width; a ϕ2 phase delay. As the data eye width (i.e., data valid interval or $t_{BIT}$) varies between low-power and boosted-bandwidth modes (e.g., to 0.5 $t_{CK}$ and 0.125 $t_{CK}$ in the 4× bandwidth boost example), the half-eye delay term varies between those two operating modes, for example, to 0.25 $t_{Ck}$ and 0.0625 $t_{Ck}$, respectively, as shown by the expressions $ϕ2_L$ and $ϕ2_H$ at 305. Phase-adjust circuit $219_3$ effects essentially the same delay as circuit $219_2$ but compensates for the write-timing signal propagation time (i.e., time for $Ck_W$ or $DQS_W$ to propagate to the memory control component, $t_{Prop(TDQ)}$) instead of the write-data propagation time—yielding time-varying phase offset ϕ3. The $DQS_W$ propagation time may incorporate propagation delay incurred within strobe mask logic 215 so that, as shown in expressions $ϕ3_H$ and $ϕ3_L$ at 305, the boost-mode and low-power mode phase delay implemented by phase adjust circuit $219_3$ vary in both the compensated propagation delay and the half-data-eye offset.

Still referring to FIG. 4, phase-adjust circuit $219_4$ delays the read-data sampling signal ($RD_{Samp}$) as necessary for alignment with the read-data arrival at the read data queue (i.e., element 239 of FIG. 3). In low-power mode (where an incoming read data strobe signal $DQS_R$ is delayed to yield the read-data sampling signal), the phase delay implemented by circuit $219_4$ (i.e., ϕ40) is sum of the system clock and clock tree propagation delays, plus the read data propagation delay and half-eye delay (0.5 $t_{Ck}$), less the propagation delay of the read data strobe signal—a phase delay that, as shown at 309, effectively shifts the incoming $DQS_R$ signal (in the form of $RD_{Samp}$) into alignment with the incoming read-data eye center. In boosted-bandwidth mode (where the high-speed clock is supplied to $219_4$), the ϕ4 delay ($ϕ4_H$) is the sum of the system clock and clock tree propagation delays, plus the read data propagation delay and half-eye delay (i.e., 0.0625 $t_{Ck}$ in the 4× boost example), referenced to the nearest system clock edge. That is, ϕ4H or ϕ4 L or any others of phase delays ϕ1-ϕ3 that exceeds one or more system clock cycles (or high-speed clock cycles) may be compensated by registering the subject timing signal in response to that clock signal to impose an integer number of full-cycle delays.

Reflecting on FIGS. 3 and 4, the number of DQ links per corresponding data timing link may vary in different embodiments and/or programmed system configurations (e.g., 1, 2, 4, 8 or more DQ links per $T_{DQ}$ link), and there may be any practicable number of DQ-link/timing-link groups within a given memory system implementation (e.g., 8 $T_{DQ}$ links each corresponding to a respective subset of 8 DQ links within a total of 64 DQ links). In a number of embodiments, each DQ-link/timing-link group is separately calibrated (e.g., has a respective set of ϕ1-ϕ4 settings) and in yet other embodiments, individual DQ links within a DQ-link/timing-link group are separately calibrated (e.g., distinct generation of phase delay ϕ2 for each DQ link to provide per-bit timing calibration). Such options and variants apply to all embodiments presented herein.

The propagation-time differences and sums shown for phase delays ϕ1-ϕ4 in FIG. 4 may incorporate other voltage- and temperature-dependent delay sources, including propagation delay through the clock divider 213, multiplexing elements 225, 237, 263 and strobe mask circuits 215, 257 shown in FIG. 3, as well as non-canceled propagation delays through signal receiver and buffer/amplifier pairs. In high-bandwidth mode, for example, $CK_R$ is delivered to phase-adjust circuit $219_4$ without incurring a driver or buffer/amplifier delay that would otherwise cancel (match) the propagation delay through the system clock driver-buffer pair ($δ_{trx}$, incurred collectively in the propagation through FIG. 3 elements 217 and 275) or the read data driver-buffer pair 273/233 (another $δ_{trx}$ and thus $2δ_{trx}$, in total). Similarly, in low-power mode the $DQS_R$ propagation delay through driver 271 and buffer/amplifier 235 cancels out (at least nominally) the read-data driver-buffer delay (elements 273/233), but not the system clock driver-buffer delay ($δ_{trx}$). In a number of embodiments, all those voltage/temperature-dependent delays, along with the clock tree delay (generally the predominant voltage/temperature-dependent delay), may be compensated through startup timing calibration operations and thereafter tracked (and compensated) through periodic calibration operations, the latter producing time-varying phase delays ϕ1-ϕ4 within circuits $219_1$-$219_4$ as necessary to meet desired timing alignment (e.g., as shown in FIG. 4).

Start-up timing calibration operations (i.e., timing calibration following system power-up or reset, prior to commencement of mission-mode memory operations) may be implemented in various ways, including memory-side loop-back of sampled signals (thus enabling the control component to compare transmitted and looped-back values while sweeping the phase of a given timing signal between maximum and minimum phase delay settings), return of sampled signals or sampling-error information through verified slow-speed signaling interface (e.g., serial input/output interface used to support chip-to-chip communication prior to initial timing calibration), operation of memory-side receivers as early-late phase-detect elements through temporary control-side timing shift that nominally aligns a transmitted signal edge (e.g., a '101010 . . . ' oscillating signal) with the memory-side sampling edge and thus enables determination of early or late sampling of the transmitted signal (with such early/late information returned to the controller to enable corresponding phase adjustment), and so forth. More generally, any practicable timing feedback arrangement may be employed within the various memory systems embodiments herein to determine an initial phase offset to be applied within phase-adjust circuits $219_1$-$219_4$ for each system operating mode (low-power and high-bandwidth).

In a number of embodiments, one or more of the start-up timing calibration operations may be periodically (or occasionally) repeated after mission-mode commencement (e.g., opportunistically when the timing path to be re-calibrated is idle)—as frequently as needed to limit time-varying (temperature/voltage-dependent) timing skew to within a specified tolerance. In other embodiments, a dedicated or shared tracking signal path is provided between the memory and control components to enable the memory component to return a tracking signal indicative of voltage/temperature-dependent delays common to all (or a subset of) the ϕ1-ϕ4 phase offsets discussed above. Referring to FIG. 3, for example, each of phase-adjust circuits $219_1$-$219_4$ may be programmed with an initial offset (or two mode-selectable offsets where different offsets apply in the low-power and high-bandwidth modes) to which a time-varying delay (i.e., voltage/temperature-dependent) delay), determined via the tracking signal, is added—a low-overhead arrangement that enables the ϕ1-ϕ4 delays imposed by phase-adjust circuits $219_1$-$219_4$ to drift together in accordance with the time-varying temperature/voltage-induced delay indicated by the tracking signal.

FIG. 5 restates the delay expressions shown at 305 in FIG. 4 in terms of an initial phase offset (i.e., offset$_1$, offset$_{2L}$, . . . , offset$_{4H}$, determined in startup timing calibration as discussed above) and a time-drifting voltage/temperature-dependent delay, showing an embodiment of a delay-tracking arrangement 350 implemented within the memory system of FIG. 3 to periodically (or occasionally) adjust the $\phi 1$-$\phi 4$ phase delays imposed by phase-adjust circuits $219_1$-$219_4$ and thus compensate for time-varying timing-domain skew. In the depicted example, phase delays $\phi 1$-$\phi 3$ drift according to (and thus are periodically updated to reflect) the voltage/temperature-dependent changes in the propagation delay (positive or negative) through clock tree 255 ($\delta^{tree}$) in both the low-power and boosted-bandwidth modes, while phase delay $\phi 4$ includes additional time-varying delays according to non-canceled driver-buffer delays as discussed above—$\delta_{trx}$ in low-power mode and $2\delta_{trx}$ in high-bandwidth mode. Other timing-path-specific delays may be compensated in alternative embodiments.

In the FIG. 5 embodiment, clock-tree delay tracking ($\delta^{tree}$) is implemented by return transmission of the memory clock signal (Ck$_{Mem}$) via a signal link otherwise used to convey error detection and correction information (EDC). That is, during a periodic timing calibration event, multiplexer 351 is switched to drive the memory clock signal (Ck$_{Mem}$) back to the control component (i.e., via driver 353, EDC/Track link and buffer/amplifier 355) where it is supplied to a delay tracking circuit 360 as a feedback clock signal, Ck$_{FB}$. Delay tracker 360 additionally receives the high-speed clock signal (Ck$_{HS}$) from clock generator 211 and a reference-select signal (RefSel), the latter selecting (via multiplexer 361) one of three differently delayed instances of the high-speed clock to be supplied as a reference clock (Ck$_{Ref}$) to a delay generator 363. In the embodiment shown, the three delayed instances of the high-speed clock include (i) a baseline reference clock 364 delayed by the propagation time through clock divider 213 (i.e., a delay modeled by element 365) and thus nominally canceling out any time-varying phase delay introduced by clock divider 213; (ii) a driver/buffer reference clock 366 delayed relative to the baseline reference by the nominal propagation delay through a signal driver-buffer-amplifier pair (modeled by delay element 367); and (iii) a double-driver/buffer reference clock 368 delayed relative to the baseline reference by the nominal propagation delay through two signal driver-buffer/amplifier pairs (modeled by delay elements 367 and 369).

Reference-selection signal, RefSel, is generated by calibration control circuitry within the control component that periodically and/or opportunistically enables delivery of the feedback clock (Ck$_{FB}$) to delay tracker 360 (i.e., configuring/commanding the memory component to drive the memory clock onto the EDC/Track link) and chooses, by virtue of the reference clock selection in multiplexer 361, which of the three time-varying phase-delay contributors ($\delta^{tree}$, $\delta^{tree}+\delta_{trx}$, or $\delta^{tree}+2\delta_{trx}$) is to be updated/adjusted during a given calibration sequence. The delay generator outputs digital delay values corresponding to the three time-varying delays, supplying a delay value corresponding to $\delta^{tree}$ to phase-adjust circuits $219_1$-$219_3$, and supplying delay values corresponding to $\delta^{tree}+\delta_{trx}$ and $\delta^{tree}+2\delta_{trx}$ to phase adjust circuit $219_4$ (i.e., in accordance with the exemplary $\phi 1$-$\phi 4$ expressions shown in FIG. 5). As shown, each of phase-adjust circuits $219_2$-$219_4$ receives the boost mode signal to enable mode-specific phase delay according to the mode-specific initial offsets ($219_2$ and $219_3$) and mode-specific initial offset and mode-specific run-time-tracked delay ($219_4$).

FIG. 6 illustrates an embodiment of a phase-adjust circuit 400 that may be used to implement phase-adjust circuit $219_4$ and phase offset $\phi 4$ as shown in FIGS. 3-5. In the depicted example, registers 401 and 403 store digital phase-offset values determined (and loaded into the subject registers) during initial calibrations of read-data timing for the low-power and high-bandwidth operating modes, respectively. The contents of registers 401 and 403 are summed with time-varying delay values, $\delta^{tree}+\delta_{trx}$ and $\delta^{tree}+2\delta_{trx}$ (i.e., values supplied by a delay tracking circuit as shown, for example, in FIG. 5 or digital representations of such values) within summing circuits 405 and 407, respectively, to yield digital delay-control values PhCtl$_{\phi 4L}$ and PhCtl$_{\phi 4H}$. The delay-control values are supplied, in turn, to digitally-controlled delay lines 409 and 411 to effect time-varying propagation delay through those delay lines and thus yield phase adjusted instances of DQS$_R$ and CK$_R$, respectively. Multiplexer 413 outputs (selects) one of the two phase-adjusted timing signal instances (i.e., DQS$_R$+$\phi 4_L$ or CK$_R$+$\phi 4_H$) in accordance with the operating mode (i.e., output of delay line 409 if Boost=0, or output of delay line 411 if Boost=1) as the read-data sample-timing signal, RDSamp.

In alternative embodiments, phase-adjust circuit 400 may implemented with a single delay line (e.g., 409) with the digital delay control values PhCtl$_{\phi 4L}$ and PhCtl$_{\phi 4H}$ multiplexed (i.e., selected according to boost signal state) to a delay-control input of the delay line (obviating timing-signal multiplexer 419 in favor of a control value multiplexer). Also, instead of delay lines, phase-mixing circuits (potentially providing finer delay granularity) may be provided to interpolate between phases of the system clock signal or high-speed clock signal. Further, the delay lines themselves may be subject to time-varying control (i.e., to maintain relatively constant propagation delay in response to a given digital control value) by signals from the clock generator (e.g., element 211 of FIGS. 3 and 5). For example, each delay line may be implemented by one or more current-starved inverter chains in which the delay through each inverter element is controlled by inverter supply voltages generated within a phase-locked loop or delay-locked loop within clock generator 211. More generally, any practicable phase-delay circuit—whether controlled digitally or by analog voltage or current—may be used to implement phase-adjust circuit 400 in alternative embodiments. Further, variants of phase-adjust circuit 400 (however implemented) may be used to implement the phase-adjust circuits $219_1$-$219_3$ discussed above. For example, the $\delta^{tree}$ value may be supplied to each of summing circuits 405 and 407 in implementations of phase-adjust circuits $219_2$ and $219_3$, and a single summing circuit, offset register and delay line (no mode-controlled multiplexer) may be sufficient to implement phase-adjust circuit $219_1$.

FIG. 7 illustrates an embodiment of a delay generator 441 that may be used to implement delay generator 363 in FIG. 5. As shown, a multi-phase reference clock (i.e., forwarded by multiplexer 361 in FIG. 5) is supplied to a phase selector/mixer circuit 445 which selects and mixes a phase-adjacent pair of the reference clock phases in accordance with digital phase word (PhWd) to produce a phase-mixed clock (Ck$_{Mix}$). In the particular embodiment shown, the multiple reference clock phases are equally phase-spaced from one another within the reference clock period (and thus a period of the high-speed clock signal generated by clock generator 211 of FIGS. 3 and 5) —in this 8-clock-phase example, by phase-spacing of 45° within a 360° clock cycle. The most significant three bits of the phase word (PhWd) constitutes a phase-pair selector that selects, within phase selector/mixer 445, one of the eight phase-adjacent clock phase pairs (i.e., Ck0/Ck45, Ck45/Ck90, Ck90/Ck135, . . . , Ck270/Ck315, or Ck315/Ck0), and the least-significant N bits of the phase word form an interpolation value that produces, also within phase selector/mixer 445, a weighted interpolation between (or mixing of) the selected clock-phase pair—yielding a phase-mixed clock ($Ck_{Mix}$) with a phase offset of $2^{PhWd[N-1:0]}*45°/2^N$ relative to the leading clock phase within the selected pair (where '*' denotes multiplication and '/' denotes division).

Still referring to FIG. 7, the phase-mixed clock is supplied, together with the incoming feed-back clock ($Ck_{FB}$), to phase detector 447 (e.g., a bang-bang phase detector, proportional phase detector, etc.) which, in turn, generates phase-up/phase-down signals according to which of the phase-detector inputs leads the other. The reference-select signal (RefSel, as discussed above) is supplied to multiplexers 449 and 450 to deliver (via multiplexer 449) the phase-up/phase-down signals to one of three digital counters 451, 453 or 455—the "active" counter—according to the delay value being adjusted and to forward (via multiplexer 450) the output of the active counter to the phase selector/mixer circuit 445 as the digital phase word. Thus, if the phase-mixed clock leads the feedback clock, phase detector 447 will assert the phase-up signal to increment the active counter (and thereby increment the digital phase word supplied to phase selector/mixer 445) so as to delay the phase-mixed clock by a phase step ($45°/2^N$), overflowing to the next more-latent clock-phase pair upon overflowing the interpolation value (i.e., interpolation value transitioning from $2^N-1$ to 0). Conversely, if the phase-mixed clock lags the feedback clock, phase detector 447 will assert the phase-down signal to decrement the active counter and thereby advance the phase-mixed clock by a phase step, underflowing to the next less-latent clock-phase pair upon overflowing the interpolation value. Thus, the delay generator iteratively adjusts the phase of the phase-mixed clock toward alignment with the feedback clock, thereby updating the digital delay values (phase words) maintained within the counters accordingly—values that may be output directly as the time-varying delay values applied within phase adjust circuits (i.e., $\delta^{free}$, $\delta^{free}+\delta_{trx}$, $\delta^{free}+2\delta_{trx}$) or that may be scaled, filtered and/or further processed to yield such values (e.g., scaled according to a phase-step difference between phase selector/mixer circuit 445 and the digital delay lines discussed in reference to FIG. 6). Further, additional circuitry may be provided within delay generator 441 to advance or delay the phase-mixed clock signal by whole reference clock cycles and thereby provide a multi-cycle phase-adjust range.

FIG. 8 illustrates an alternative embodiment of a memory system having on-demand bandwidth boost, in this case conveying read and write data strobe signals between control component 481 and memory component 483 via separate (respective) signaling links ($T_{WD}$ and $EDC/Trk/DQS_R$) while operating in low-power mode. Further, access to the read data strobe link is time-multiplexed within memory component (multiplexer 485) to enable EDC data and/or feedback-clock (tracking clock) transmission according to operations commanded by control component 481. As shown, the shared read data strobe link is coupled to EDC circuitry 487 and delay tracking circuitry 489 within the memory component, and also to the read-data-strobe input to multiplexer 237 (i.e., to provide a timing source for read-data sampling during low-power operation). Other circuitry may be provided within the control and memory components as generally described above.

FIG. 9 illustrates exemplary mode registers 501 and 503 that may be implemented respectively within the various control and memory component embodiments discussed above. In the depicted implementation, mode register 501 (within the control component) includes a bandwidth mode field (HBM) and a transition-control field (TC), the latter enabling programmable selection of either host-controlled or autonomous transition between boosted bandwidth and low-power operating modes. More specifically, if a logic '0' is stored within the transition-control field, the control component will operate statically in either the low power mode or high bandwidth mode according to the value programmed within in the bandwidth mode field, and thus will switch between those two modes in response to host-commanded change to the HBM field setting. In autonomous transition mode, by contrast, the control component monitors the fill-depth of a transaction queue (e.g., within the command/address storage buffer 221 discussed in reference to FIG. 3) —a first-in-first-out (FIFO) structure into which command/address values are loaded as they arrive from the host system (e.g., processor or other component). The fill-depth of the transaction queue (e.g., offset between pointers to the head of the queue and tail of the queue in a ring-buffer implementation as shown at 523) effectively indicates the memory bandwidth requested by the host (i.e., filling to a greater depth as command/address values backlog within queue 521 and shrinking to a shallow or zero depth as the bandwidth demand drops) and thus may be used to trigger autonomous transition between low-power and high-bandwidth operating modes. In one embodiment, for example, a queue manager 525 within command/address buffer 221 monitors the fill-depth of queue 521, outputting a corresponding depth value to a comparator which, in turn, raises or lowers signal 528 according to whether the threshold is exceeded. The mode-transition threshold ("thresh") may itself be programmed within mode register 501 (or other storage) of the control component and separate thresholds may be provided for transitioning to and from boosted-bandwidth mode (i.e., those separate thresholds establishing hysteretic transition into and out of boost-mode to avoid rapid dither back and forth between the two operating modes). In the depicted example, multiplexer 529 selects either the output of threshold comparator 527 or the value programmed within the HBM field of mode register 501—according to the value programmed within the TC field of mode register 501—to drive the boost signal to other circuitry within the control component (e.g., as discussed above). In one embodiment, the control component responds to transition of the boost signal (indicating a transition between low-power and high-bandwidth operating modes) by issuing a mode-register programming command to the memory component (together with value to be programmed within the mode register) and thereby slaves the memory component operating mode to that of the control component.

FIG. 10 illustrates memory system transition from low-power mode to high-bandwidth mode and then back to low-power mode, showing exemplary command write data and write-data timing signals during the mode transitions. As shown, write command/address (WR1) is transmitted to the memory component via the CA links while the system is operating in low-power mode, causing the write data strobe to transition a short time later from idle to preamble to active-edge toggling phases (followed by post-amble), with the active edges specifying memory-side data sampling time for serial data values D0-D7 within burst 541. At 543, the memory system commences transition (autonomously or in response to host command) from the low-power mode to the boost mode, issuing a mode-register programming command (MRS) to the memory component shortly thereafter. Note that low-to-high transition of the boost signal (i.e., from low-power mode to high-bandwidth mode) may be deferred until after the low-power data burst concludes (or the mode-register transition may be deferred until all low-power timing edges have been applied). In any case, the timing signal on link $T_{DQ}$ changes over seamlessly (without runt-pulses or other glitch) from strobe to high-speed clock (optionally truncating the DQS postamble at 545), making ready for boost-mode (high-bandwidth) write data transfer in response to write commands WR2, WR3 and WR4 (triggering high-speed data transfers at 551, 553 and 555). At 563 the system returns to low-power mode, again issuing a mode register programming command to the memory component and changing over the write-data timing signal from a free-running high-speed clock to a parked data strobe. As with the transmission from low-power mode to high-bandwidth mode, transition of the boost signal may be deferred until the last of the high-bandwidth data transfer operations is concluded (or additional delay may be enforced to provide time for such conclusion prior to mode transition). In any case, after transitioning back to low-power mode, a write command (WR5) triggers a strobe-timed write data transmission at 571.

The various circuits and component architectures disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, bandwidth ratios, clock ratios, signaling protocols and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be driven with single-ended or differential signals. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit memory component comprising:
   a command/address interface to receive a first command/address value from a control component during a first interval and a second command/address value from the control component during a second interval;
   a timing signal interface to receive a write-data strobe signal from the control component during the first interval, and to receive a write-data clock signal from the control component during the second interval, the write-data strobe signal departing from a parked voltage level to commence toggling at a time within the first interval corresponding to time of reception of the first command/address value via the command/address interface, and the write-data clock signal toggling throughout the second interval regardless of time of reception of the second command/address value via the command/address interface; and
   a data interface to sample first write data corresponding to the first command/address value at times within the first interval indicated by toggling of the write-data strobe signal, and to sample second write data corresponding to the second command/address value at times within the second interval indicated by toggling of the write-data clock signal.

2. The memory component of claim 1 wherein the write-data clock signal toggles throughout the second interval at a higher frequency than a frequency at which the write-data strobe signal toggles after the write-data strobe commences toggling.

3. The memory component of claim 1 wherein the write-data strobe signal ceases toggling after the data interface samples the first write data, and wherein the write-data clock signal continues toggling after the data interface samples the second write data.

4. The memory component of claim 1 wherein the first and second intervals correspond to operation of the memory component in first and second operating modes, respectively.

5. The memory component of claim 4 further comprising a mode register to store a first mode-control value that specifies the first operating mode during the first interval and to store a second mode-control value that specifies the second operating mode during the second interval.

6. The memory component of claim 1 wherein the timing signal interface comprises a first signal receiver to receive both the write-data strobe signal and the write-data clock signal from the control component via a first timing signal link during the first and second intervals, respectively.

7. The memory component of claim 1 further comprising transmit circuitry to transmit a timing signal to the control component to enable iterative phase-adjustment, within the control component, of the write-data strobe signal and the write-data clock signal.

8. The memory component of claim 7 wherein:
the timing signal interface further receives a system clock signal from the control component;
the memory component further comprises a clock tree circuit to provide multiple phase-delayed instances of the system clock signal; and
the transmit circuitry to transmit the timing signal to the control component comprises circuitry to transmit at least one of the phase-delayed instances of the system clock signal to the control component.

9. The memory component of claim 7 further comprising a core storage array, and wherein the transmit circuitry to transmit the timing signal to the control component comprises a circuitry to transmit the timing signal to the control component via a first signal line during a timing calibration interval and to transmit error correction data corresponding to data stored within the core storage array prior to and after the timing calibration interval.

10. The memory component of claim 7 further comprising a core storage array, and wherein:
the data interface comprises circuitry to transmit read data from the core storage array to the control component; and
the transmit circuitry to transmit the timing signal to the control component comprises a circuitry to transmit the timing signal to the control component via a first signal line during a timing calibration interval and to transmit a read-data strobe signal to the control component via the first signal line prior to the timing calibration interval, the read-data strobe signal corresponding to the read data transmitted by the data interface.

11. A method of operation within an integrated-circuit memory component, the method comprising:
receiving a first command/address value from a control component during a first interval and a second command/address value from the control component during a second interval;
receiving a write-data strobe signal from the control component during the first interval and a write-data clock signal from the control component during the second interval, the write-data strobe signal departing from a parked voltage level to commence toggling at a time within the first interval corresponding to time of reception of the first command/address value, and the write-data clock signal toggling throughout the second interval regardless of time of reception of the second command/address value;
sampling first write data corresponding to the first command/address value at times within the first interval indicated by toggling of the write-data strobe signal; and
sampling second write data corresponding to the second command/address value at times within the second interval indicated by toggling of the write-data clock signal.

12. The method of claim 11 wherein the write-data clock signal toggles throughout the second interval at a higher frequency than a frequency at which the write-data strobe signal toggles after the write-data strobe commences toggling.

13. The method of claim 11 wherein the write-data strobe signal ceases toggling after the data interface samples the first write data, and wherein the write-data clock signal continues toggling after the data interface samples the second write data.

14. The method of claim 11 further comprising transitioning the memory component from a first operating mode to a second operating mode to conclude the first interval and commence the second interval.

15. The method of claim 14 wherein transitioning the memory component from the first operating mode to the second operating mode comprises overwriting a first mode value within a mode register of the memory component with a second mode value, the first and second mode values specifying the first and second operating modes of the memory component, respectively.

16. The method of claim 11 wherein the timing signal interface comprises a first signal receive to receive both the write-data strobe signal and the write-data clock signal from the control component via a first timing signal link during the first and second intervals, respectively.

17. The method of claim 11 further comprising transmitting a timing signal to the control component to enable iterative phase-adjustment, within the control component, of the write-data strobe signal and the write-data clock signal.

18. The method of claim 17 further comprising receiving a system clock signal from the control component and providing, via a clock tree circuit, multiple phase-delayed instances of the system clock signal, and wherein transmitting the timing signal to the control component comprises transmitting at least one of the phase-delayed instances of the system clock signal to the control component.

19. The method of claim 17 wherein transmitting the timing signal to the control component transmitting the timing signal to the control component via a first signal line during a timing calibration interval, the method further comprising transmitting error correction data corresponding to data stored within a core storage array of the memory component prior to and after the timing calibration interval.

20. The method of claim 17 further comprising retrieving read data from a core storage array of the memory component and transmitting the read data to the control component, and wherein transmitting the timing signal to the control component comprises transmitting the timing signal to the control component via a first signal line during a timing calibration interval, the method further comprising transmitting a read-data strobe signal to the control component via the first signal line prior to the timing calibration interval, the read-data strobe signal corresponding to the read data transmitted by the data interface.

21. An integrated-circuit memory component comprising:
  means for receiving a first command/address value from a control component during a first interval and a second command/address value from the control component during a second interval;
  means for receiving a write-data strobe signal from the control component during the first interval and a write-data clock signal from the control component during the second interval, the write-data strobe signal departing from a parked voltage level to commence toggling at a time within the first interval corresponding to time of reception of the first command/address value, and the write-data clock signal toggling throughout the second interval regardless of time of reception of the second command/address value; and
  means for sampling first write data corresponding to the first command/address value at times within the first interval indicated by toggling of the write-data strobe signal, and for sampling second write data corresponding to the second command/address value at times within the second interval indicated by toggling of the write-data clock signal.

* * * * *